United States Patent
Ogiso

(10) Patent No.: US 7,215,210 B2
(45) Date of Patent: May 8, 2007

(54) CLOCK SIGNAL OUTPUTTING METHOD, CLOCK SHAPER AND ELECTRONIC EQUIPMENT USING THE CLOCK SHAPER

(75) Inventor: Hiroyuki Ogiso, Suwa (JP)

(73) Assignee: Seiko Epson Corporation (JP)

( * ) Notice: Subject to any disclaimer, the term of this patent is extended or adjusted under 35 U.S.C. 154(b) by 110 days.

(21) Appl. No.: 11/068,345

(22) Filed: Feb. 28, 2005

(65) Prior Publication Data

US 2005/0190001 A1 Sep. 1, 2005

(30) Foreign Application Priority Data

Mar. 1, 2004 (JP) .............................. 2004-056183

(51) Int. Cl.
*H03L 7/00* (2006.01)

(52) U.S. Cl. ............................. 331/18; 331/49; 327/20; 327/292

(58) Field of Classification Search .................. 331/18, 331/49; 327/292, 20
See application file for complete search history.

(56) References Cited

U.S. PATENT DOCUMENTS 4,868,513 A * 9/1989 Piercy et al. ................ 327/156
5,260,979 A * 11/1993 Parker et al. ................ 375/366
6,362,670 B1 * 3/2002 Beaulieu ..................... 327/156
6,801,093 B2 * 10/2004 Kuwajima ................... 331/18
6,970,045 B1 * 11/2005 Lichter et al. ................ 331/2

FOREIGN PATENT DOCUMENTS

JP 10-065536 3/1998
JP 2001-244812 9/2001

* cited by examiner

*Primary Examiner*—Robert Pascal
*Assistant Examiner*—Levi Gannon
(74) *Attorney, Agent, or Firm*—Harness, Dickey & Pierce, P.L.C.

(57) ABSTRACT

A clock signal outputting method in which either a clock signal based on a signal from the outside or an alternative clock signal from a fixed oscillator is selected and outputted, wherein, when the clock signal is selected to be outputted, the fixed oscillator is put into non-operating state, and when any error occurs in the clock signal, the fixed oscillator is operated to output the alternative clock signal.

4 Claims, 5 Drawing Sheets

CLOCK SIGNAL OUTPUTTING METHOD, CLOCK SHAPER AND ELECTRONIC EQUIPMENT USING THE CLOCK SHAPER

RELATED APPLICATIONS

This application claims priority to Japanese Patent Application No. 2004-056183 filed Mar. 1, 2004 which is hereby expressly incorporated by reference herein in its entirety.

BACKGROUND

1. Technical Field

The present invention relates to a clock signal outputting method, a clock shaper and electronic equipment using the clock shaper, and more particularly relates to a clock signal outputting method, a clock shaper and electronic equipment using the clock shaper specifying the operation of a fixed oscillator provided in the clock shaper.

2. Related Art

A network clock signal distributes a common frequency into the network and synchronizes the network. A reference clock signal is distributed to each slave station from a master station or quasi-master station of the network. Transmission and reception are performed in each slave station based on a received clock signal timing-extracted from data received from the transmission path of the network.

Incidentally, when a line fault occurs in the network, a slave station cannot normally receive data from the transmission path, and cannot reproduce the received clock signal. In this case, the slave station cannot transmit and receive until the line fault recovers. In order to prevent this, a clock supply device is provided in the slave station to synchronize with the reference clock signal outputted from the master station, and transmission and reception are performed based on a standby clock signal outputted from this clock supply device. In addition, when a clock signal is lost (missing) within a certain time from the received clock signal or a standby clock signal, transmission and reception are performed based on a clock signal outputted from a fixed oscillator provided in the slave station.

A clock shaper using a Phase Locked Loop (PLL) circuit is used in a transmission device constituting a network communication system. Two selecting parts are provided on a pre-stage of the clock shaper. One selecting part receives inputs of a received clock signal and a standby clock signal, and selects either clock signal. The other selecting part receives inputs of a received clock signal or a standby clock signal and a clock signal outputted from the fixed oscillator, and selects either clock signal.

Japanese Unexamined Patent Publication No. H10-65536 and Japanese Unexamined Patent Publication No. 2001-244812 disclose a device receiving inputs of two clock signals and outputting either clock signal to a PLL circuit. Japanese Unexamined Patent Publication No. H10-65536 discloses suppression of frequency variation in the output from a PPL circuit in a clock signal switching operation by outputting a self-running clock that is always synchronized with a selected clock outputted from the clock signal switching circuit to the PLL circuit from a self-running control circuit provided between the clock signal switching circuit and the PLL circuit when switching the clock signal due to a short break. In addition, Japanese Unexamined Patent Publication No. 2001-244812 discloses that, when switching from a first clock signal to a second clock signal, a switching device provided on an input side of the PLL circuit switches a clock signal in phase with the first clock signal outputted from an oscillator, and then switches from the clock signal to the second clock signal when the difference in phase between the clock signal outputted from this oscillator and the second clock signal becomes lower than a predetermined value.

In the clock shaper according to the above-mentioned art, if a fixed oscillator is provided against a line fault, when the fixed oscillator is always kept oscillating, the received clock signal or standby clock signal (input signal) and the clock signal outputted from the fixed oscillator are inputted into the selecting part. As such, there is a problem in that phase noise is generated in the signal outputted from the selecting part when the frequency of the input signal differs from that of the clock signal outputted from the fixed oscillator.

The present invention has been achieved to solve the above problem, and one object is to provide a control method, a clock shaper and electronic equipment using the clock shaper, that are capable of performing quick synchronized compensation without generating any phase noise in a signal outputted from the selecting part and even when synchronization is not performed by occurrence of a fault in the input signal.

SUMMARY

To achieve the above object, a clock signal outputting method is provided in which either a clock signal based on a signal from the outside or an alternative clock signal from a fixed oscillator is selected and outputted, wherein, when the clock signal is selected, the fixed oscillator switches to a non-operating state, and when an error occurs in the clock signal, the fixed oscillator operates to output the alternative clock signal.

While the clock signal (input signal) based on the signal from the outside is selected, the fixed oscillator does not operate. For this reason, only the clock signal is inputted to a part selecting the clock signal based on the signal from the outside and the alternative clock signal outputted from the fixed oscillator. This eliminates phase noise from being generated by input of the clock signal and the alternative clock signal, thereby obtaining a high quality signal. In addition, when any missing occurs of the clock signal, the fixed oscillator can be operated (oscillated) to switch to the alternative clock signal outputted from the fixed oscillator.

Furthermore, a clock shaper according to the present invention comprises a fixed oscillator generating an alternative clock signal being outputted when the clock signal based on the signal from the outside is abnormal, a selecting part receiving inputs of the clock signal and the alternative clock signal and outputting either one, and a signal detecting part monitoring the clock signal, putting the fixed oscillator into a non-operating state to operate the selecting part to output the clock signal when the clock signal is normal, and operating the fixed oscillator and further operating the selecting part to output the alternative clock signal when any error occurs in the clock signal.

The clock signal (input signal) based on a signal from the outside and the alternative clock signal outputted from the fixed oscillator can be inputted into the selecting part. While the selecting part is selecting the input signal, the fixed oscillator does not operate (oscillate). For this reason, while the selecting part is selecting the input signal, only the input signal is inputted into the selecting part, therefore, no phase noise occurs in the signal outputted from the selecting part. This allows the clock signal outputted from the selecting part to be of high quality. In addition, if any error such as missing of the input signal, the fixed oscillator can be operated (oscillated) to input the alternative clock signal into the selecting part, and this alternative clock signal can be outputted from the selecting part.

Furthermore, the clock shaper comprises a phase comparing part receiving inputs of the clock signal or the alternative clock signal outputted from the selecting part and a clock signal from a feedback loop, comparing the phases, and outputting the compared result as a phase difference signal, a loop filter receiving input of the phase difference signal to smooth, and outputting as a control voltage, and a voltage control type oscillating circuit receiving input of the control voltage and outputting a clock signal having a frequency according to the control voltage to the feedback loop and outside. This allows a signal phase synchronized with the input signal or the alternative clock signal inputted into the selecting part to be outputted, thereby resulting in securing quick system synchronization.

Furthermore, in the clock shaper, the fixed oscillator is oscillation-controlled or power-controlled based on the control signal outputted from the signal detecting part. This allows the fixed oscillator to be operated based on the control signal. In other words, when the control signal is not inputted into the fixed oscillator, the fixed oscillator does not operate to generate the alternative clock signal. However, when the signal is inputted, the fixed oscillator operates to output the alternative clock signal to the selecting part.

Furthermore, the clock signal based on a signal from the outside has a received clock signal timing-extracted from received data from the transmission path and a standby clock signal synchronized with a reference clock signal transmitted from the master station or quasi-master station, and the clock shaper further comprises a second selecting part receiving inputs of the received clock signal and standby clock signal and selecting either one of the clock signal, a received clock signal missing detecting part monitoring for a missing state of the received clock signal when the second selecting part selects the received clock signal, operating the second selecting part to select the standby clock signal when the received clock signal is detected as missing.

This allows the clock signal to be switched to the standby clock signal when the received clock signal is missing, and thereby the system can be quickly synchronization compensated. Further, the second selecting part and the received clock signal missing detecting part are provided on a pre-stage of the selecting part, and therefore, the system can be quickly synchronization compensated by the alternative clock signal outputted from the fixed oscillator even when the standby clock signal is missing. Further, even when either one of the received clock signal or the standby clock signal is inputted to the selecting part as an input signal, no phase difference occurs in the clock signal outputted from the selecting part.

In addition, electronic equipment using a clock shaper according to the present invention comprises the above-mentioned clock shaper. This allows electronic equipment capable of quickly synchronization compensating to be obtained even when an external device delays detection of an error such as signal loss (missing) or delays switching operation.

DETAILED DESCRIPTION

Figure 1:
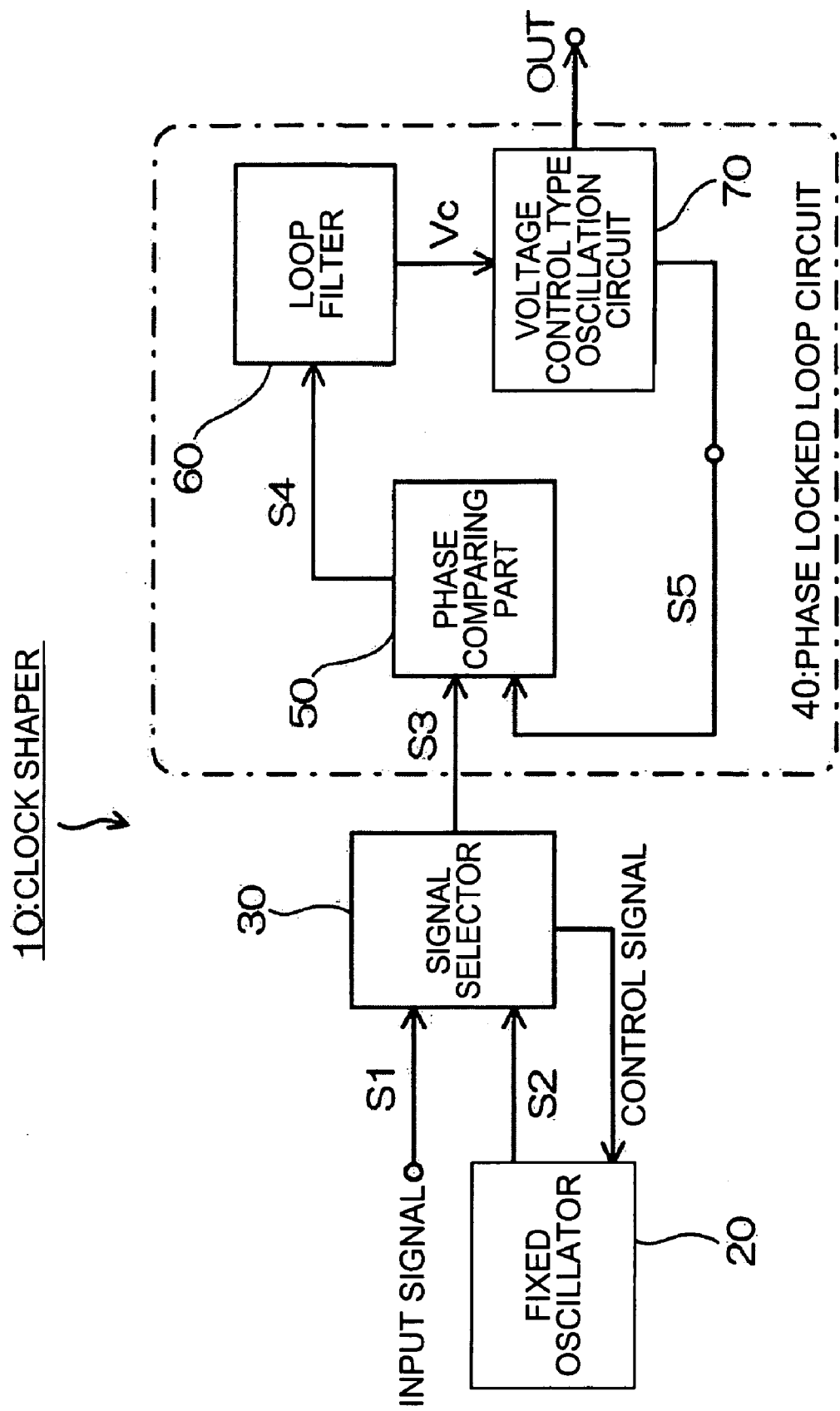
FIG. 1 is a block diagram of a clock shaper according to the present embodiment.

Preferred embodiments of a clock signal outputting method, a clock shaper and electronic equipment using the clock shaper according to the present invention will be described below. FIG. 1 shows a block diagram of a clock shaper. A clock shaper 10 is constituted to have a signal selector 30, which receives inputs of a clock signal (input signal S1) based on a signal from the outside and an alternative clock signal S2 outputted from a fixed oscillator 20. A Phase Locked Loop (PLL) circuit 40 is connected to a post-stage of this signal selector 30.

Here, the clock signal based on the signal from the outside is a received clock signal or a standby clock signal, and the received signal refers to a clock signal timing-extracted from data received from a transmission path, and the standby clock signal refers to a clock signal supplied from an external clock supply device (not shown), synchronized with a reference clock signal of a master station or a quasi-master station.

The signal selector 30 selects either one of the input signal S1 or the alternative clock signal S2 outputted from the fixed oscillator 20, and monitors errors such as a missing state of the input signal S1. Here, a "missing" means a state that the clock signal is lost for a certain time. In other words, for example, it means a state of missing for a short time such as a short break, or a state that a clock signal is not generated due to a fault which occurs in the transmission device or line and the missing of the signal continues for a relatively long time. Then, the signal selected in the signal selector 30 is outputted as a clock signal S3.

The PLL circuit 40 comprises a phase comparing part 50 comparing the clock signal S3 outputted from the signal selector 30 and a clock signal S5 from the feedback loop and outputting a phase difference signal S4 based on the comparison result, a loop filter 60 smoothing the phase difference signal S4 and outputting it as a control voltage Vc, and a voltage control type oscillation circuit 70 changing the frequency of a clock signal S5 outputted according to this control voltage Vc. In addition, the voltage control type oscillation circuit 70 may be either a voltage control type piezo-oscillation circuit using an AT cut piezo-oscillator including quartz and the like or a voltage control type SAW oscillation circuit using a surface acoustic wave (SAW) resonator.

Figure 2:
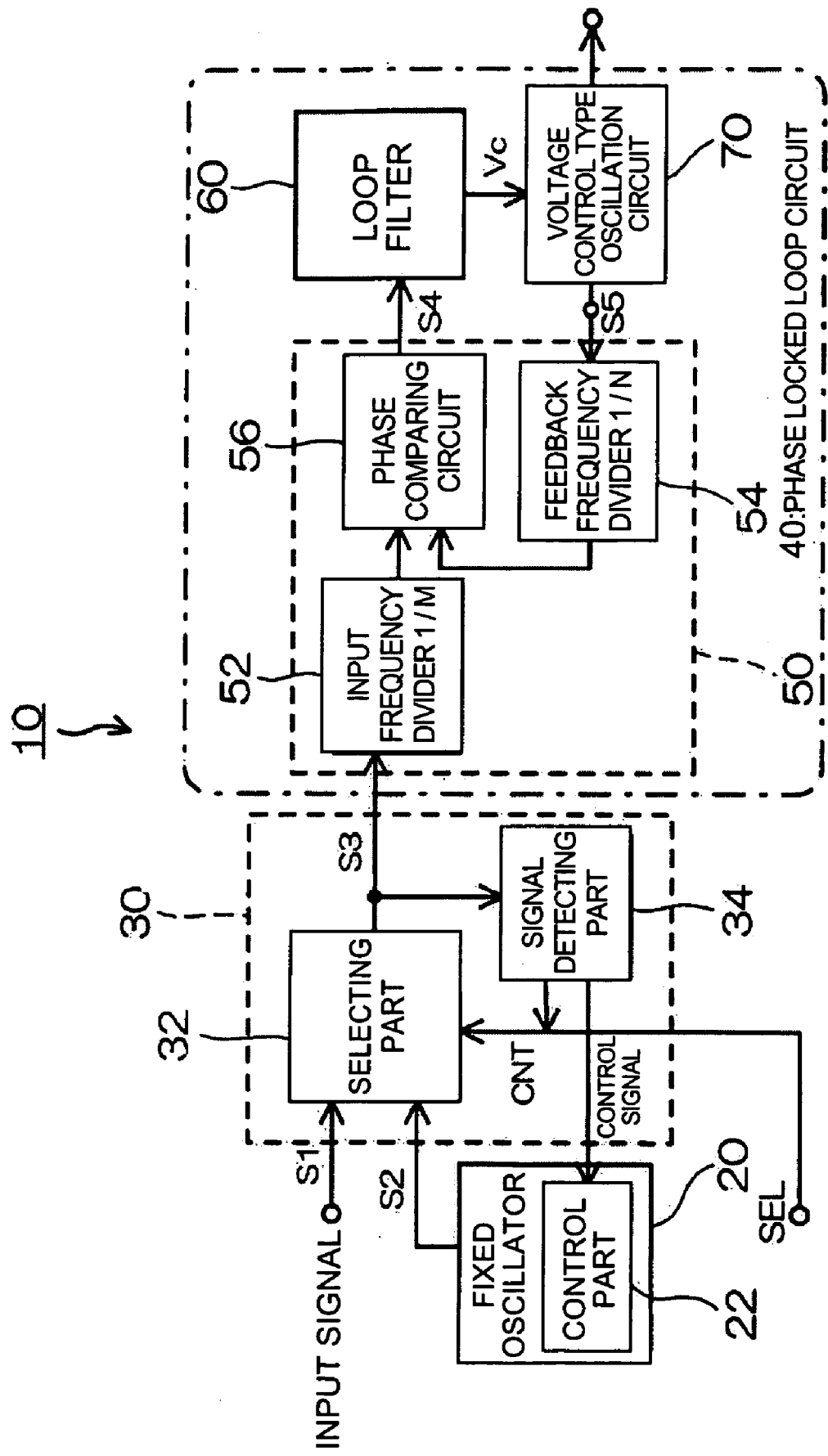
FIG. 2 is a block diagram describing each configuration of a clock shaper according to the present embodiment.

Next, a more detailed configuration of the above-mentioned clock shaper 10 will be described. FIG. 2 shows a block diagram describing the configuration of the clock shaper 10. The fixed oscillator 20 is used as a clock signal source for securing temporary synchronization when the input signal S1 continues to be missing. Therefore, an oscillation circuit using an AT cut piezo-oscillator including quartz and the like and an oscillation circuit using a SAW resonator may be used as the fixed oscillator 20. The fixed oscillator 20 has a control part 22 which power-controls and oscillation-controls the fixed oscillator 20. In addition, while the signal selector 30 selects the input signal S1, the fixed oscillator 20 is controlled by the control part 22 to be put into a non-operating state, and not to output the alternative clock signal S2 to the signal selector 30.

The signal selector 30 is configured to have a selecting part 32 and a signal detecting part 34. The selecting part 32 selects either the input signal S1 or the alternative clock signal S2 outputted from the fixed oscillator 20 according to a selecting signal from the outside. Further, the signal detecting part 34 monitors a missing state of the input signal S1 when the selecting part 32 selects the input signal S1. When the signal detecting part 34 detects that the input signal S1 is missing, it outputs a control signal for operating the fixed oscillator 20 to the control part 22, and further outputs a switching signal CNT to the selecting part 32. When the selecting part 32 receives the switching signal CNT, it switches to the alternative clock signal S2 outputted from the fixed oscillator 20 prior to selecting the signal from the outside. In addition, when the selecting part 32 switches to the alternative clock signal S2, the signal detecting part 34 does not monitor the alternative clock signal S2.

The phase comparing part 50 comprises an input frequency divider 52 (dividing ratio 1/M) provided on the post-stage of the selecting part 32, a feedback frequency divider 54 (dividing ratio 1/N) provided in the feedback loop and a phase comparing circuit 56 provided on the post-stages of the input frequency divider 52 and the feedback frequency divider 54. The input frequency divider 52 and the feedback frequency divider 54 make the high frequency clock signal inputted into them a lower frequency. Then, the clock signal S3 outputted from the selecting part 32 is divided into 1/M in the input frequency divider 52, and the clock signal S5 for the feedback loop outputted from the voltage control type oscillation circuit 70 is divided into 1/N in the feedback frequency divider 54, the phases of the respective clock signals are compared in the phase comparing circuit 56, and then the phase difference signal S4 having a voltage level according to the phase difference is outputted to the loop filter 60.

Figure 3:
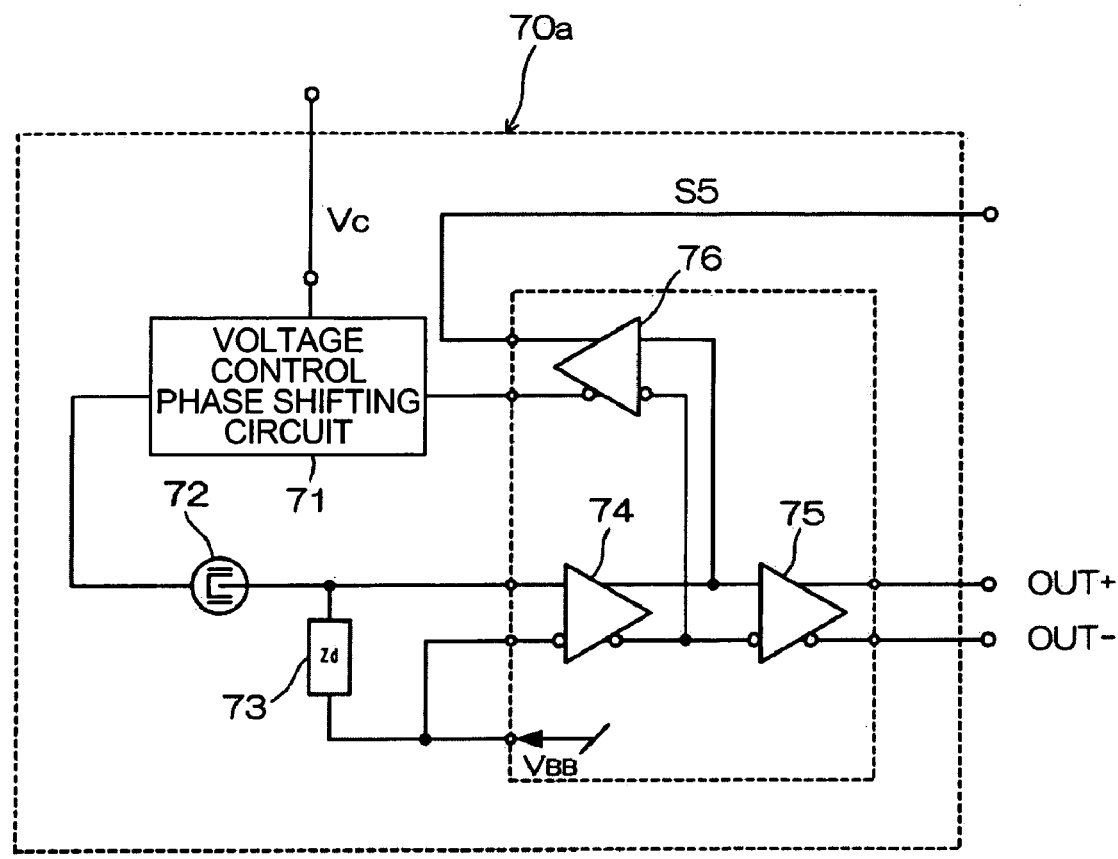
FIG. 3 is a block diagram of a voltage control type SAW oscillation circuit.

When the voltage control type SAW oscillation circuit is used for the voltage control type oscillation circuit 70, the following configuration is allowed. FIG. 3 shows a block diagram of a voltage control type SAW oscillation circuit. A voltage control type SAW oscillation circuit 70a comprises a voltage control phase shifting circuit 71, a SAW resonator 72, an impedance circuit 73, an oscillation differential amplifier 74, an output differential amplifier 75 and a feedback buffer differential amplifier 76. A positive feedback oscillation loop is formed by at least the voltage control phase shifting circuit 71, SAW resonator 72, oscillation differential amplifier 74, and the feedback buffer differential amplifier 76. In addition, the oscillation differential amplifier 74, output differential amplifier 75 and the feedback buffer differential amplifier 76 are respectively of a differential amplification circuit using an ECL line receiver (Emitter Coupled Logic).

Figure 4:
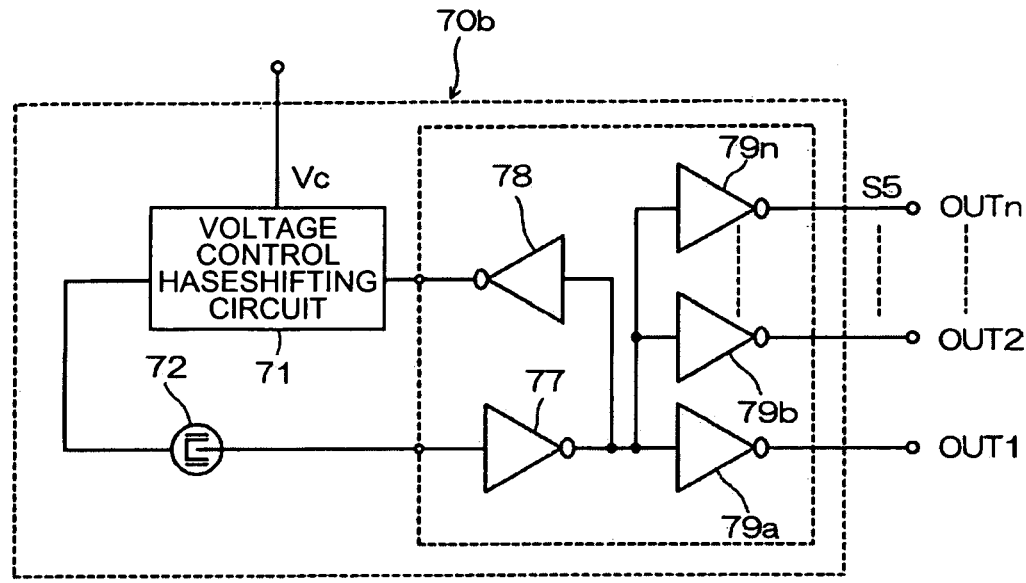
FIG. 4 is a block diagram of a voltage control type SAW oscillation circuit according to another configuration.

Further, the following voltage control type SAW oscillation circuit can be used instead of the voltage control type SAW oscillation circuit 70a shown in FIG. 3. FIG. 4 shows a block diagram of a voltage control type SAW oscillation circuit according to this configuration. A voltage control type SAW oscillation circuit 70b according to this configuration comprises the voltage control phase shifting circuit 71, SAW resonator 72, an oscillation amplifier 77, a feedback buffer amplifier 78 and a plurality of output amplifiers 79 (79a, 79b through 79n). A positive feedback oscillation loop is formed by at least the voltage control phase shifting circuit 71, SAW resonator 72, oscillation amplifier 77 and the feedback buffer amplifier 78. Then, the output signals from the oscillation amplifier 77 are outputted through the plurality of output amplifiers 79, one output among these outputs should be the clock signal S5 for the feedback loop, and the other outputs can be used as outputs from the clock shaper 10.

Next, an operation of the clock shaper 10 will be described. First, operation in a normal state where no missing is detected of the input signal S1 will be described. The input signal S1 is inputted into the selecting part 32, and the input signal S1 is selected in the selecting part 32 by the selecting signal inputted from the selecting terminal SEL. At this time, the fixed oscillator 20 does not operate (oscillate), therefore, the alternative clock signal S2 from the fixed oscillator 20 is not inputted to the selecting part 32. The clock signal S3 outputted from the selecting part 32 is monitored for missing occurrences, however, missing does not normally occur, therefore, the clock signal is inputted as it is into the phase comparing part 50. Further, the clock signal S5 for the feedback loop outputted from the voltage control type oscillation circuit 70 is also inputted into the phase comparing part 50. Then, the clock signal S3 outputted from the selecting part 32 is divided into 1/M in the input frequency divider 52, and then, inputted into the phase comparing circuit 56. Further, the clock signal S5 for the feedback loop is divided into 1/N in the feedback frequency divider 54, and then inputted into the phase comparing circuit 56. The phase comparing circuit 56 compares phase difference of the respective clock signals which were divided and whose frequencies were lowered, and outputs the compared result to the loop filter 60 as the phase difference signal S4. The loop filter 60 smoothes the phase difference signal S4 and outputs the control voltage Vc to the voltage control type oscillation circuit 70. The voltage control type oscillation circuit 70 changes the frequency of the clock signal S5 for the feedback loop according to the control voltage Vc, and outputs the clock signal S5 to the phase comparing part 50.

Next, an abnormal operation when the input signal S1 is detected to be missing will be described. In addition, here, the operation will be described under the assumption that the other system or transmission device delays detection of the abnormality, or switching operation delays, and for this reason, the clock shaper 10 quickly detects the abnormality. If data is not normally transmitted and timing extraction is not performed from the received data because a line fault occurs in a transmission path, it is assumed that the received clock signal is missing for a certain time for example. Thus, since the input signal S1 is missing, missing also occurs in the clock signal S3 outputted from the selecting part 32. This missing in the clock signal S3 is detected by the signal detecting part 34.

The signal detecting part 34 which detected the missing occurrence outputs a control signal to the control part 22 of the fixed oscillator 20, and at the same time, generates a switching signal CNT and outputs it to the selecting part 32. When the control signal is inputted to the fixed oscillator 20, the fixed oscillator starts to operate (oscillate), and outputs the alternative clock signal S2 to the selecting part 32. Further, the selecting part 32 is compulsorily switched to receive the alternative clock signal S2 from the fixed oscillator 20 by the switching signal CNT, and synchronization is compensated based on this alternative clock signal S2.

The alternative clock signal S2 outputted from the fixed oscillator 20 is selected in the selecting part 32, and then is inputted to the phase comparing part 50 as the clock signal S3. The operation after the phase comparing part 50 is same as the normal operation after the phase comparing part 50, therefore, the description will be omitted.

Such a clock shaper 10 is provided with the selecting part 32 selecting either the input signal S1 or the alternative clock signal S2 outputted from fixed oscillator 20, and a signal detecting part 34 monitoring missing of the input signal S1. In a normal state when the input signal S1 is not detected as missing by the signal detecting part 34, the fixed oscillator 20 does not operate and does not oscillate. For this reason, the alternative clock signal S2 from the fixed oscillator 20 is not inputted into the selecting part 32, and only the input signal is inputted thereto. Therefore, phase noise does not occur in the clock signal S3, thereby obtaining a noiseless high quality signal.

Further, if any missing occurs of the input signal, the signal detecting part 34 detects the missing state and the input signal can be compulsorily switched to the alternative clock signal S2 from the fixed oscillator 20. Therefore, even when the other device or a functional block delays to detect or delays switching operation, synchronization of the system can be quickly secured by the alternative clock signal S2 based on the fixed oscillator 20 of the clock shaper 10.

In addition, the above-mentioned embodiment describes a configuration to input either the received clock signal or the alternative clock signal into the selecting part 32. Any configuration to input the received clock signal as it is into the selecting part 32 can use a configuration of the above-mentioned clock shaper 10. However, if the received signal and standby clock signal are inputted and any one of the clock signals is inputted into the selecting part 32 as the input signal S1, it is necessary to provide a clock signal selecting part on the pre-stage of the selecting part 32.

Figure 5:
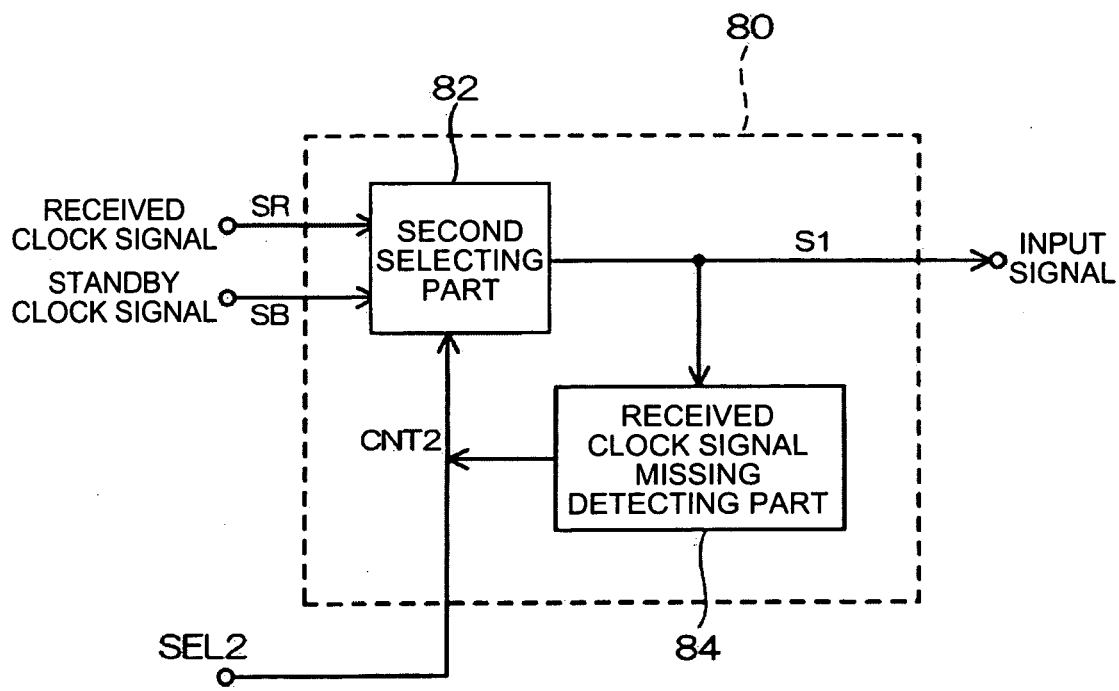
FIG. 5 is a block diagram of a clock signal selecting part.

FIG. 5 shows a block diagram of the clock signal selecting part. A clock signal selecting part 80 comprises a second selecting part 82 and a received clock signal missing detecting part 84. The second selecting part 82 receives inputs of a received clock signal SR and a standby clock signal SB and selects either one of the clock signals by a second selecting signal from the outside. Further, when the received clock signal SR is selected by the second selecting part 82, the received clock signal missing detecting part 84 monitors a missing state of this clock signal SR.

Next, operation of the clock signal selecting part 80 will be described. The received clock signal SR and standby clock signal SB are inputted into the second selecting part 82, and then the received clock signal SR is selected by the second selecting signal inputted into the second selecting part 82 from a second selecting terminal SEL. The selected received clock signal SR is outputted from the second selecting part 82 as the input signal S1, and a missing state is monitored in the received clock signal missing detecting part 84. In a normal state when no missing is detected, the input signal S1 is inputted to the selecting part 32, and then inputted into the phase comparing part 50 without a missing state being detected by the signal detecting part 34 (refer to FIG. 2).

Further, if the received clock signal SR is selected and any error occurs in that missing is detected of the input signal S1 outputted from the second selecting part 82, the received clock signal missing detecting part 84 outputs a second switching signal CNT2 to the second selecting part 82. When the second selecting part 82 receives input of the second switching signal CNT2, the second selecting part 82 compulsorily switches to the standby clock signal SB prior to the second selecting signal from the outside. Then, the standby clock signal SB selected by the second selecting part 82 is outputted as the input signal S1, and further inputted into the selecting part 32 without missing being detected by the received clock signal missing detecting part 84. When it is outputted from the selecting part 32, missing is detected by the signal detecting part 34. Operation after missing is detected by the signal detecting part 34 is performed according to the above-mentioned embodiment, therefore, a description of the operation after this will be omitted.

In addition, when only the received clock signal SR is inputted into the signal selector 30 as the input signal S1, missing of the clock signal is monitored by the signal detecting part 34. However, when the clock signal selecting part 80 is on the pre-stage of the signal selector 30, and either one of the received clock signal SR or standby clock signal SB is inputted as the input signal S1, the signal detecting part 34 monitors missing only of the standby clock signal SB.

By providing such a clock signal selecting part 80 on the pre-stage of the signal selector 30, when missing occurs of the received clock signal SR, the clock signal selecting part 80 detects this missing and can switch to the standby clock signal SB. In addition, when any missing occurs of the standby clock signal SB, the signal selector 30 detects this missing and can switch to the alternative clock signal S2 outputted from the fixed oscillator 20. Therefore, even if the other device or a functional block delays to detect or delays a switching operation, synchronization of the system can be quickly secured by the standby clock signal SB and the alternative clock signal S2 outputted from the fixed oscillator 20.

Figure 6:
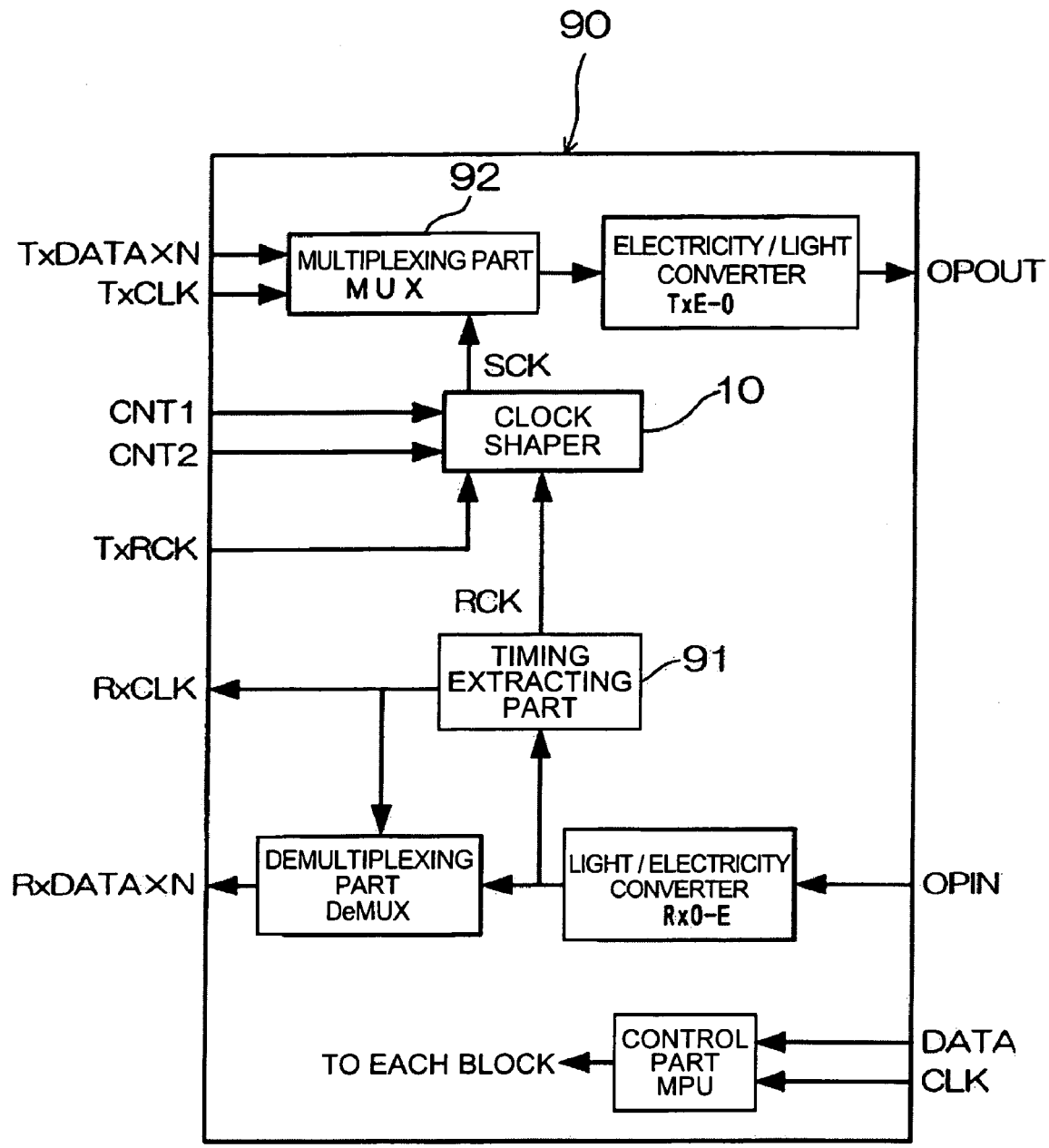
FIG. 6 is a block diagram showing an overview of an optical transceiver module using the clock shaper.

Next, one example of electronic equipment on which the clock shaper 10 provided with the clock signal selecting part 80 on the pre-stage of the signal selector 30 is mounted, will be described. FIG. 6 shows a block diagram showing an overview of an optical transceiver module using the clock shaper 10. This optical transceiver module 90, for example, realizes an interface function for light/electricity conversion and electricity/light conversion, and multiplexing and demultiplexing.

The clock shaper 10 receives inputs of a low frequency clock signal (RCK) having many jitters timing-extracted in a timing extracting part 91, and a standby clock signal (TxRCK) sent out from external clock supply device or the like (not shown). In a normal state, this clock signal (RCK) having many jitters is selected in the clock shaper 10 based on first and second selecting signals CNT1, 2, and shaped to a high frequency clock signal (SCK) with a reduced number of jitters. Then, this clock signal (SCK) is used in a multiplexing part 92 as a clock signal for multiplexing transmission data (TxDAT) of N pieces as one transmission data.

By using the above-mentioned clock shaper 10 for the optical transceiver module 90, when any missing occurs of the selected clock signal, the clock shaper 10 detects the missing state of clock signal, and then the selected clock signal can be compulsorily switched to the standby clock signal or clock signal outputted from the fixed oscillator 20. In particular, when an external device or the other functional block delays to detect the missing or delays a switching operation, quick synchronization can be compensated to be secured by the prioritized switching.

Further, if a received clock signal having many jitters is inputted, it can be converted into a high frequency clock signal including a very small number of jitters to be fed to the multiplexing part 92 by the above-mentioned clock shaper 10. This allows the timing margin between the transmission data (TxDATA×N) multiplexed in the multiplexing part 92 and the clock signal to be secured, thereby preventing a malfunction of the transmission data in the multiplexing part.

What is claimed is:

1. A clock shaper, comprising:
   a fixed oscillator generating an alternative clock signal to be output if an error occurs in a clock signal based on an outside signal;
   a selecting part receiving inputs of the clock signal and the alternative clock signal and outputting either one; and
   a signal detecting part monitoring the clock signal wherein the signal detecting part:
      makes the fixed oscillator go to a non-operating state so that the selecting part outputs the clock signal if the clock signal is normal; and
      operates the fixed oscillator and the selecting part to output the alternative clock signal if an error occurs in the clock signal,
   wherein the fixed oscillator comprises at least one of an oscillation-controlled and a power-controlled oscillator based on the control signal outputted from the signal detecting part.

2. The clock shaper according to claim 1 further comprising:
   a phase comparing part receiving inputs of the clock signal or the alternative clock signal outputted from the selecting part and a clock signal from a feedback loop, comparing the phases, and outputting the compared result as a phase difference signal;
   a loop filter receiving, smoothing and outputting the phase difference signal as a control voltage; and
   a voltage control oscillation circuit receiving the control voltage and outputting a clock signal having a frequency according to the control voltage to the feedback loop and outside.

3. Electronic equipment using a clock shaper, comprising the clock shaper according to claim 1.

4. A clock shaper, comprising:
   a fixed oscillator generating an alternative clock signal to be output if an error occurs in a clock signal based on an outside signal;
   a selecting part receiving inputs of the clock signal and the alternative clock signal and outputting either one; and
   a signal detecting part monitoring the clock signal wherein the signal detecting part:
      makes the fixed oscillator go to a non-operating state so that the selecting part outputs the clock signal if the clock signal is normal; and
      operates the fixed oscillator and the selecting part to output the alternative clock signal if an error occurs in the clock signal,
   wherein the clock signal based on a signal from the outside has a received clock signal timing-extracted from received data from a transmission path and a standby clock signal synchronized with a reference clock signal transmitted from at least one of a master station and a quasi-master station,
   and further comprising:
   a second selecting part receiving inputs of the received clock signal and a standby clock signal and selecting either one of the clock signals;
   a received clock signal missing detecting part monitoring a missing state of the received clock signal when the second selecting part selects the received clock signal, and operating the second selecting part to select the standby clock signal when the received clock signal is detected as missing.

\* \* \* \* \*